United States Patent
Parker et al.

(10) Patent No.: US 12,000,887 B2
(45) Date of Patent: Jun. 4, 2024

(54) WIRELESS ELECTRONIC-CONTROL SYSTEM

(71) Applicant: Lam Research Corporation, Fremont, CA (US)

(72) Inventors: Christopher-James Parker, Beaverton, OR (US); Dirk Rudolph, Dundee, OR (US); Mark James Garfield Hnatiuk, Sherwood, OR (US)

(73) Assignee: Lam Research Corporation, Fremont, CA (US)

( * ) Notice: Subject to any disclaimer, the term of this patent is extended or adjusted under 35 U.S.C. 154(b) by 358 days.

(21) Appl. No.: 17/294,342

(22) PCT Filed: Nov. 20, 2019

(86) PCT No.: PCT/US2019/062498
§ 371 (c)(1),
(2) Date: May 14, 2021

(87) PCT Pub. No.: WO2020/106900
PCT Pub. Date: May 28, 2020

(65) Prior Publication Data
US 2022/0011364 A1 Jan. 13, 2022

Related U.S. Application Data

(60) Provisional application No. 62/770,587, filed on Nov. 21, 2018.

(51) Int. Cl.
| | | |
|---|---|---|
| *G01R 31/317* | (2006.01) | |
| *G01R 31/28* | (2006.01) | |
| *H04W 84/18* | (2009.01) | |

(52) U.S. Cl.
CPC ... *G01R 31/31713* (2013.01); *G01R 31/2806* (2013.01); *H04W 84/18* (2013.01)

(58) Field of Classification Search
CPC .......... G01R 31/31713; G01R 31/2806; G01R 31/01; G01R 31/31712; H04W 84/18
See application file for complete search history.

(56) References Cited

U.S. PATENT DOCUMENTS

| | | |
|---|---|---|
| 6,813,739 B1 | 11/2004 | Grannis, III |
| 8,041,834 B2 | 10/2011 | Ferri et al. |
| (Continued) | | |

FOREIGN PATENT DOCUMENTS

| | | |
|---|---|---|
| CN | 101315411 A | 12/2008 |
| CN | 101932943 A | 12/2010 |
| (Continued) | | |

OTHER PUBLICATIONS

"Taiwanese Application Serial No. 108142274, First Office Action mailed Jun. 19, 2023", w english translation, 25 pgs.

(Continued)

*Primary Examiner* — Alvaro E Fortich
(74) *Attorney, Agent, or Firm* — Schwegman Lundberg & Woessner, P.A.

(57) ABSTRACT

Various embodiments include methods and apparatuses to test production tools and related electrical components therefor including individual printed-circuit boards (PCBs). In one example, a test-plug hardware-platform includes at least one input/output (I/O) connector, and a configurable control system to provide command and operational signals through the I/O connector and collect data through the I/O connector from at least one PCB under test. A wireless-mesh network within the test-plug hardware-platform can interface wirelessly with at least the PCB under test. The at least one PCB operating within a production tool or other piece of equipment. Other methods and systems are disclosed.

24 Claims, 7 Drawing Sheets

(56) References Cited

U.S. PATENT DOCUMENTS

| | | | |
|---|---|---|---|
| 8,615,374 B1 * | 12/2013 | Discenzo | G06F 15/00 340/521 |
| 2002/0082725 A1 | 6/2002 | Dute et al. | |
| 2007/0038894 A1 * | 2/2007 | Stasa | G06F 11/3688 714/38.1 |
| 2009/0300437 A1 | 12/2009 | Bhame et al. | |
| 2014/0125363 A1 | 5/2014 | Bock et al. | |
| 2015/0341236 A1 | 11/2015 | Trevino et al. | |
| 2016/0343548 A1 * | 11/2016 | Howald | G01R 27/28 |
| 2017/0276702 A1 | 9/2017 | Freer | |
| 2018/0156868 A1 | 6/2018 | Batz et al. | |
| 2018/0313889 A1 | 11/2018 | Su et al. | |

FOREIGN PATENT DOCUMENTS

| | | |
|---|---|---|
| CN | 202267736 | 6/2012 |
| CN | 104198868 A | 12/2014 |
| CN | 105842572 A | 8/2016 |
| CN | 113167830 | 7/2021 |
| EP | 0159907 A2 | 10/1985 |
| TW | 200923382 | 6/2009 |
| TW | M458558 | 8/2013 |
| TW | 201504647 | 2/2015 |

OTHER PUBLICATIONS

"Singaporean Application Serial No. 202111551799.X, Response filed Mar. 27, 2023 to Search Report and Written Opinion mailed Nov. 3, 2022", w English claims, 16 pgs.

International Application Serial No. PCT/US2019/062498, International Preliminary Report on Patentability mailed Jun. 3, 2021, 8 pgs.

"Singaporean Application Serial No. 202111551799.X, Response filed Mar. 27, 2023 to Search Report and Written Opinion mailed Nov. 3, 2022", w English claims, 14 pgs.

International Application Serial No. PCT/US2019/062498, International Search Report mailed Mar. 5, 2020, 4 pgs.

International Application Serial No. PCT/US2019/062498, Written Opinion mailed Mar. 5, 2020.

"Singaporean Application Serial No. 202111551799.X, Search Report and Written Opinion mailed Nov. 3, 2022", 10 pgs.

"Taiwanese Application Serial No. 108142274, Response filed Sep. 18, 2023 to First Office Action mailed Jun. 19, 2023", w english claims, 5 pgs.

"Singapore Application Serial No. 11202105198X, Written Opinion mailed Jan. 5, 2024", 8 pgs.

Chinese Application Serial No. 201980076394.X, Office Action mailed Mar. 30, 2024, w/ English Translation, 23 pgs.

* cited by examiner

WIRELESS ELECTRONIC-CONTROL SYSTEM

CLAIM OF PRIORITY

This application is a U.S. National Stage Filing under 35 U.S.C. 371 from International Application No. PCT/US2019/062498, filed on Nov. 20, 2019, and published as WO 2020/106900 A1 on May 28, 2020, which claims the priority benefit to U.S. Patent Application Ser. No. 62/770,587, filed on Nov. 21, 2018, and entitled "WIRELESS ELECTRONIC-CONTROL SYSTEM," each of which is incorporated by reference herein in its entirety.

TECHNICAL FIELD

The subject matter disclosed herein relates to testing of various production tools used in the semiconductor and related industries. More specifically, the disclosed subject matter relates to a configurable "test plug" form factor input/output. (I/O) control board with purposes including quick system testing, diagnostics, and troubleshooting of one or more production tools.

BACKGROUND

Various tools used in the semiconductor and related industries use a number of different types of electronic-control system. These electronic-control systems bridge the gap between software and the hardware used for substrate (e.g., silicon wafer) processing. The various tools include, for example, process tools (such as etch tools, deposition tools, and cleaning tools), metrology tools (such as substrate scanners and various types of inspection tools), and other types of tools used in the used in the semiconductor and related industries. This variety of tools is simply referred to as "production tools" herein for brevity, although various types of related research and development (R&D) and other off-line and in-situ tools are included as a part of the term "production tool" as well.

For each production tool, custom printed-circuit boards (PCBs) are developed to support routing of signals from I/O controllers, safety interlock devices, power distribution, support circuitry for external devices, and other functions. In addition, there are normally multiple versions of each custom PCB developed due to changes in specifications of the tools, problems fixed (necessitating a new PCB), etc.

The normal process for a controls group when a new PCB is ordered and received is to manually bench test and verify the functionality of the entire PCB. Depending on the complexity of the PCB, the testing procedure may take one or more engineers anywhere from an hour to several days to complete.

Contemporaneous testing includes manually moving jumpers between connectors on the PCBs to read or activate an I/O as shown in FIG. 1A. For example, FIG. 1A shows a first node 110 (node 0), a second node 120 (node 1), and a third node 130 (node 2). Each of these nodes is used to connect to various ports on a PCB manually. More or fewer nodes may be needed depending an a level of complexity of a connected PCB. The higher the number of nodes, the more complexity in wiring to the PCB and the more possibility of errors in making connections. Further, as noted above, many tools have safety-interlock devices that must also be tested for proper functionality. Safety-interlock devices are generally programmable and therefore quickly updated. However, the safety-interlock devices often require manual jumper-based testing after every change.

FIG. 1B shows custom test plugs 150 produced by a manufacturer of PCBs to test specific nodes of a tool. However, these custom test plugs are expensive. Significantly, these custom test plugs provide no automated testing capabilities, so all tests must be run manually. Also, once a PCB or tool is modified, a new test plug must be constructed and provided by the manufacturer.

FIG. 1C shows one test platform 170 that uses existing I/O controllers (IO Cont. Node 0, IO Cont. Node 1, . . . IO Cont. Node x) to test various nodes. However, for each tool, one or more custom PCBs and/or cables must be constructed to connect the system to various test nodes (Test IO Cont. Node x . . . Test IO Cont. Node 1, Test IO Cont. Node 0). Therefore, the test platform of FIG. 1C still requires custom-made PCBs for every type of I/O controller used in a tool.

In addition to hardware verification, software has to be developed and tested. Much of the software development is done with simulated I/O. Simulation of the IO allows the software developer to test many aspects of the software but does not allow for testing of the low-level communication required when communicating with hardware. Many new problems are often discovered by the software developers once they get access to the real hardware and they are no longer simulating I/O of the tool. Testing an actual tool can result in delays to system integration and the rest of the project since much of this testing has to wait until the tool is built. Moreover, current software-simulation models cannot always be programmed to capture actual problems encountered by the tools such as system lockups and substrate breakage scenarios. When the software is run on the actual tool, the tool is taken out-of-production and can shut down an entire process line (if already installed in a fabrication facility). Also, the software testing often requires the scrapping of test substrates or, in the case of deposition tools, a waste of expensive precursor gases and/or precursor liquids.

The information described in this section is provided to offer the skilled artisan a context for the following disclosed subject matter and should not be considered as admitted prior art.

DETAILED DESCRIPTION

Figure 1A:
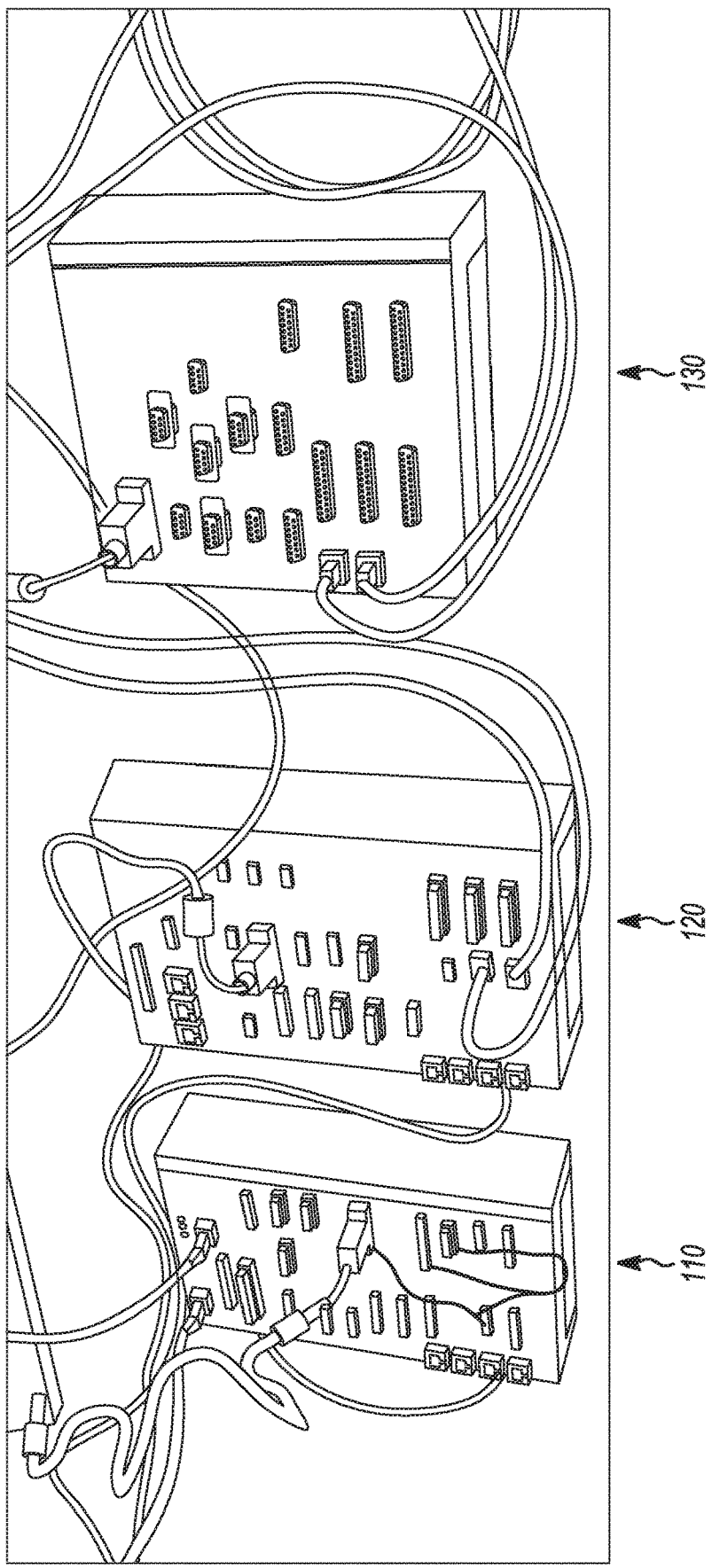
FIGS. 1A-1C show examples of various types of hardware and/or software test systems currently in use.

The disclosed subject matter will now be described in detail with reference to a few general and specific embodiments as illustrated in various ones of the accompanying drawings. In the following description, numerous specific details are set forth in order to provide a thorough understanding of the disclosed subject matter. It will be apparent, however, to one skilled in the art, that the disclosed subject matter may be practiced without some or all of these specific details. In other instances, well-known process steps or structures have not been described in detail so as not to obscure the disclosed subject matter.

The disclosed subject matter contained herein described relates generally to operations and testing of production tools and electrical components thereof. Such production tools can include various types of deposition (including plasma-based tools such as atomic layer deposition (ALD), chemical vapor deposition (CVD), plasma-enhanced CVD (PECVD), and so on, as well as etching tools (e.g., reactive-ion etching (RIE) tools), and various types of thermal furnaces (e.g., such as rapid thermal annealing (RTA) and oxidation), ion implantation, and a variety of other process and metrology tools found in various fabs and known to a person of ordinary skill in the art. However, the disclosed subject matter is not limited to semiconductor environments and can be used in a number of machine-tool environments such as robotic assembly, manufacturing, and machining environments.

For ease in understanding the disclosed subject matter, various examples will be provided with reference to a semiconductor fabrication production tool. However, upon reading and understanding the disclosure provided herein, the person of ordinary skill in the art will recognize that various embodiments of the test-plug hardware-platform of the present disclosure can be used in a wide variety of environments where various types of tool or tools are used.

In general, various embodiments of the disclosed subject matter comprise a configurable "test plug" form factor input/output (I/O) control board that can be used for, for example, quick system testing, diagnostics, and troubleshooting of production tools and associated printed-circuit boards (PCBs) and other electrical components.

Therefore, the disclosed subject matter provides a way to test quickly and substantially simultaneously the functionality of every standard and custom PCB developed for, for example, a production tool. With various embodiments of the disclosed subject matter, in order to test one or more PCBs on a production tool, a test plug is coupled from one or more of the test-plug hardware-platforms described herein to each connector on the PCB. The test engineer then uses software to configure the test plug I/O and perform tests as needed. Once configuration is complete, the engineer can start the automated testing. The configuration can be saved for faster testing of other similar or identical PCBs if needed in the future.

Once set up, multiple PCBs of the same type (or even a similar type with modifications as needed) can also be tested quickly and substantially simultaneously. Further, software will be able to test low-level communication with actual (as opposed to simulated) hardware (e.g., to the PCB while still mounted within the production tool). The test engineer can use the software to do this testing on the bench and solve problems before system integration. Therefore, the subject matter disclosed herein describes a configurable and flexible test-plug hardware-platform, comprising an I/O board and wireless electronic control system as described herein. Further, each of the arrangements and configurations of various embodiments of the test-plug hardware-platform is defined in greater detail below.

Figure 2:
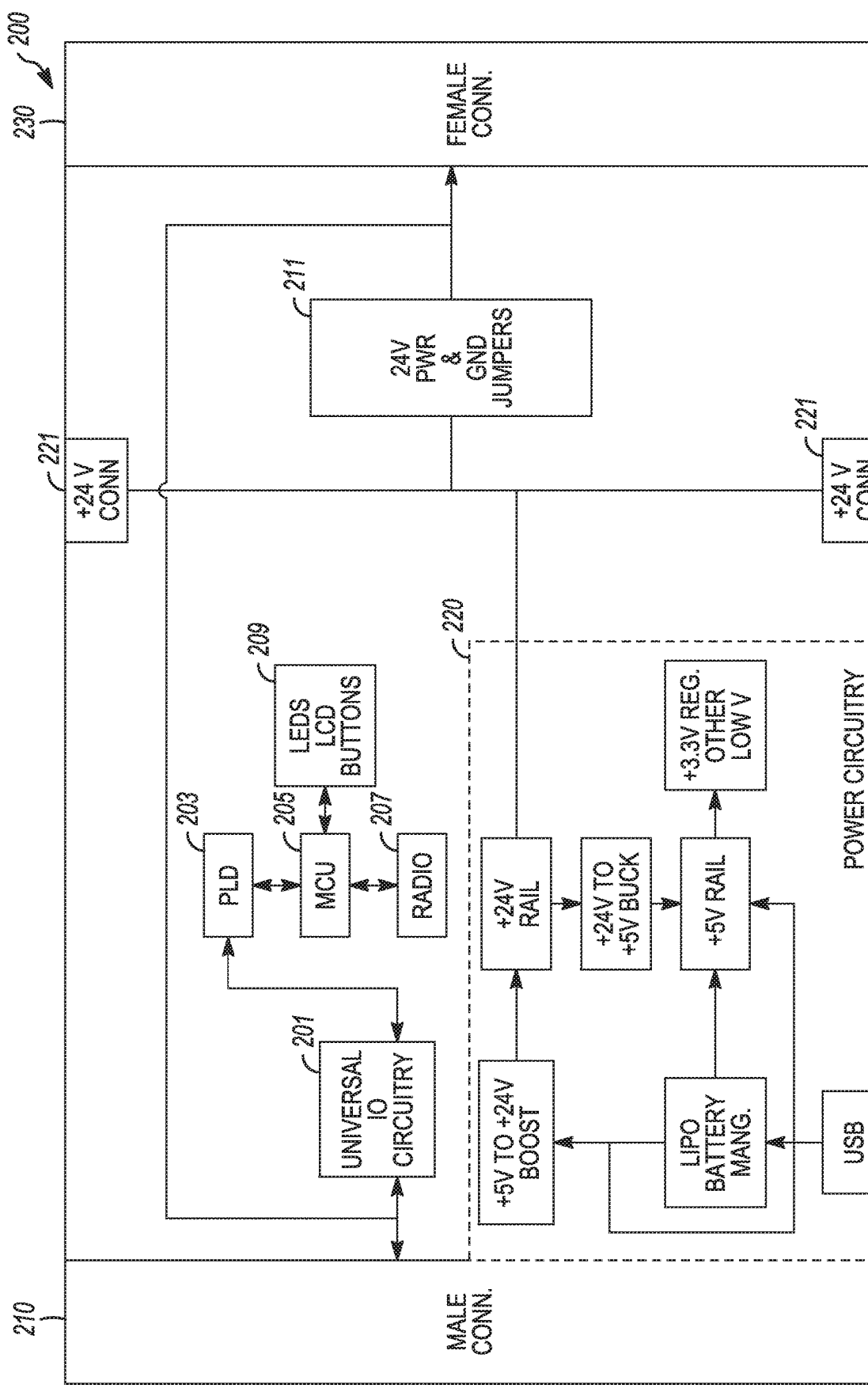
FIG. 2 shows an exemplary embodiment of a configurable test-plug hardware-platform, according to various exemplary embodiments.

For example, with reference now to FIG. 2, an example of a configurable test-plug hardware-platform 200 (a configurable control system including, for example, at least one input/output (I/O) connector and a wireless-mesh network) according to various exemplary embodiments is shown. Computer software may be used to monitor inputs and command outputs on the test-plug hardware-platform, as described in more detail below. A configuration of the computer software may be based on an existing signal list and interlock table for a particular production tool. In various embodiments, the signal list and interlock tables may be directly imported into the software from a predefined table. A software-based user interface (UI) allows for I/O status checking and manipulation. The UI can also run automated I/O tests to verify the functionality of the hardware being tested. Overall, the test-plug hardware-platform 200 can be used for quick system-testing, system-diagnostics, and troubleshooting of various PCBs for a production tool or the production tool itself. The test-plug hardware-platform 200 therefore provides a robust, reliable, and quickly configurable diagnostic and validation system for a production tool and related electrical components.

Although the configurable test-plug hardware-platform 200 of FIG. 2 shows only a single male connector 210 and a single female connector 230 to avoid obfuscating the disclosed subject matter, in various embodiments, the test-plug hardware-platform 200 can include any number of male and female connectors. Also, the single male connector 210 and the single female connector 230 may be reversed in orientation compared with the orientation shown in FIG. 2.

For example, in various embodiments, the test-plug hardware-platform 200 can include multiple types of common electrical-connector types such as D-type subminiature ("DSUB") electrical connectors to interface with various ones of the electrical PCBs and other electrical components found on a production tool. DSUB electrical connectors are known to a person of ordinary skill in the art and include, for example, DA-15 connectors, DB-25 connectors, DC-37 connectors, DD-50 connectors, DE-9 connectors, DB13W3 connectors, and a number of other electrical connector types used in the industry. Such connectors can support various 9-, 15-, 25-, 37-, and 50-pin standard density DSUB1 connectors as well as 15-, 26-, 44-, 62-, and 78-pin high-density DSUB connectors. Additionally, certain types of DSUB connectors may also include, for example, coaxial connectors used to support high frequency devices (e.g., RF devices) and video-signal connections.

Additionally, in various embodiments, the test-plug hardware-platform 200 can include other common electrical-connector types such as IEEE 1394 (FireWire®), Thunderbolt®, Universal Serial Bus (USB®), and other connector types known in the art. The test-plug hardware-platform 200 can also include various types of relays, opto-couplers, safety interlocks, and other electrical components. These other electrical components may also be configurable by software.

Regardless of the type of electrical connector used, each of the pins on all of the electrical connectors are separately configurable, via software (and/or hardware in certain configurations), such as supplying or receiving power, ground, various types of analog and digital signals (e.g., AI, AO, DI, or DO) and various other types of signals known in the art (e.g., video signals for various types of metrology tools), with all tested substantially simultaneously.

Figure 1B:
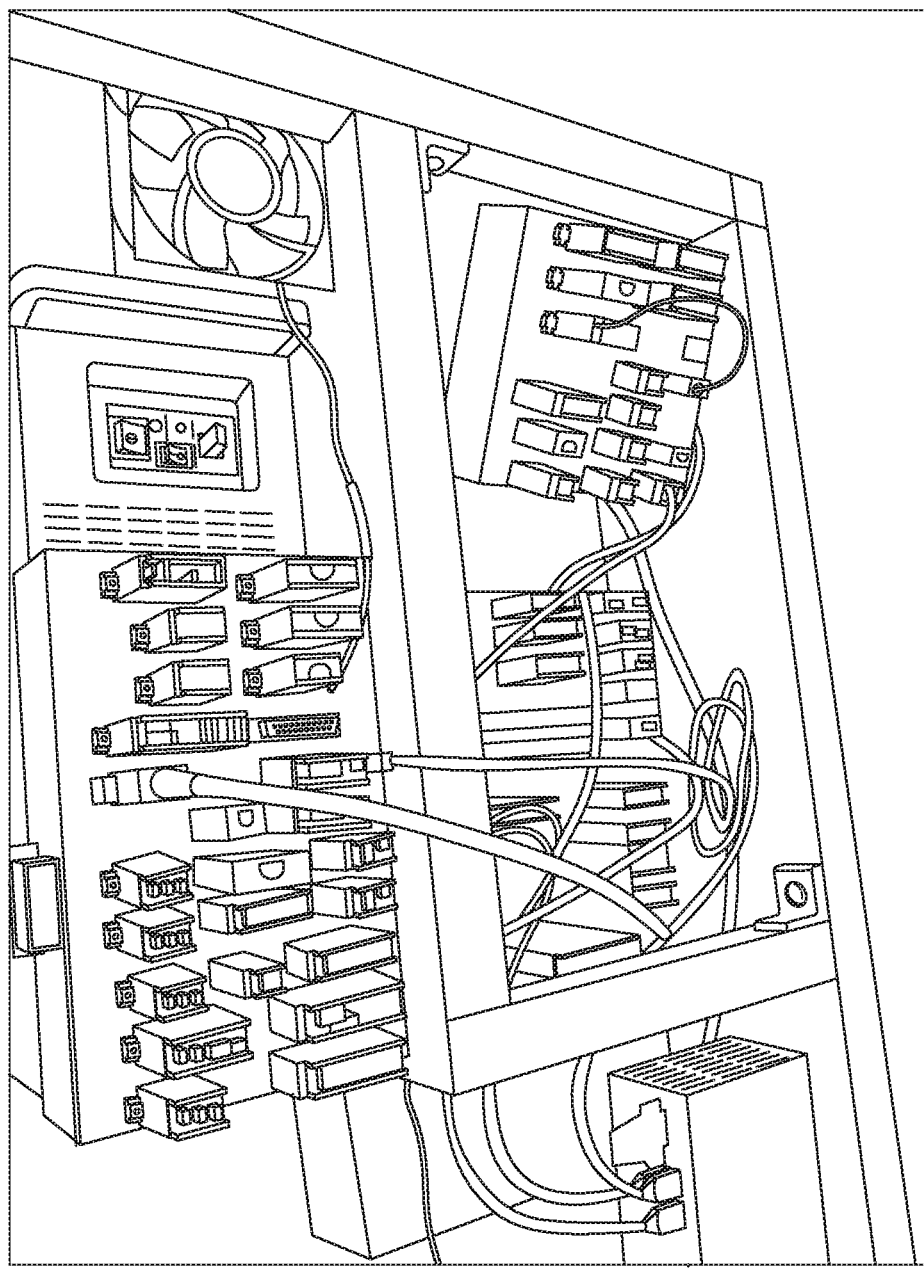
Figure 1C:
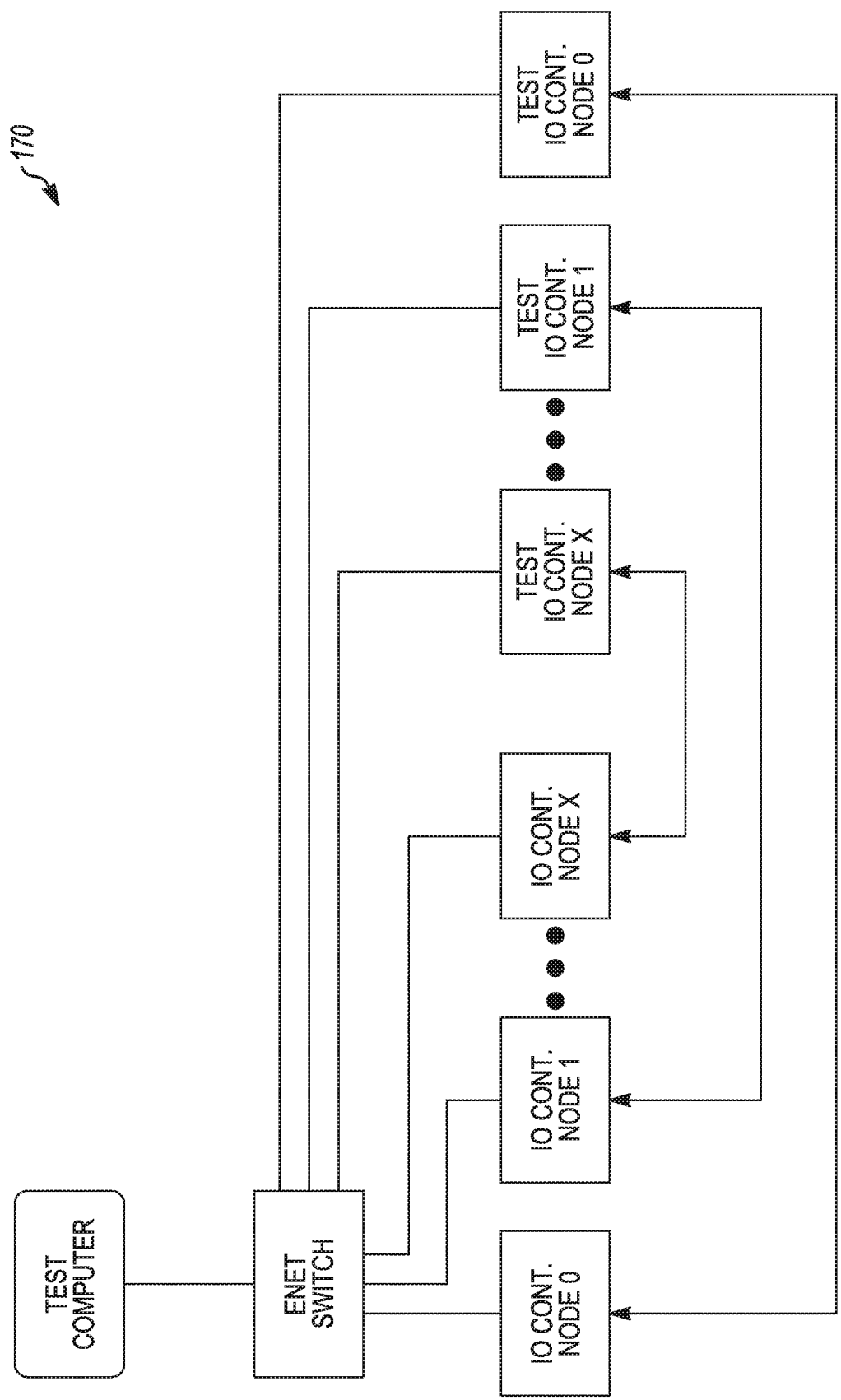

Consequently, the test-plug hardware-platform 200 can readily be configured to work with a number of different types of production tools (and related PCBs and other electrical components) without the laborious rewiring (including breadboarding and other techniques involving the use of jumper wires for electrical reconnections as shown in FIG. 1A), or the fabrication of tool-specific boards for a particular production tool only (as shown in FIG. 1B), as are used under the prior art. Therefore, various embodiments of the test-plug hardware-platform 200 allows the testing of, for example, input output controller (IOC) outputs (e.g., AO, DO) that may be mapped, via software, to inputs of the test-plug hardware-platform 200 (e.g., AI, DI). Similarly, IOC inputs (e.g., AI, DI) may be mapped, via software, to outputs of the test-plug hardware-platform 200 (e.g., AO, DO). Special IO-like contact closures can be tested with a combination of outputs and inputs as will be recognizable to a person of ordinary skill in the art upon reading and understanding the disclosure provided herein.

With continuing reference to FIG. 2, various embodiments of the test-plug hardware-platform 200 may also include universal I/O circuitry 201, one or more programmable logic devices (PLDs) 203 to build reconfigurable digital circuits, one or more microcontroller units (MCUs) 205 used to, for example, manipulate, correlate, or direct data received from or sent to a production tool (or save to a memory device (not shown)), a radio source 207 (including, for example, Bluetooth® or other wireless devices described below) to receive or transmit data to and from the production tool or other external devices, a number of LED and/or LCD buttons 209 (which may include various displays, readouts, etc.) and a number of other types of electrical-connector support circuitry as is known in the art. In various embodiments, the radio source 207 can be used to interface with a wireless-mesh network, as described in more detail below with reference to FIG. 3. FIG. 2 is also shown to include a number of 24 V connections 221. The skilled artisan will readily recognize that the 24 V level is stated merely for convenience in understanding. Various voltages, higher or lower than 24 V, may of course be included instead of or in addition to the 24 V connections.

The test-plug hardware-platform 200 may be powered from IOC or various types of either internal power circuitry 220 and/or external power-supplies (not shown) as needed. As shown in FIG. 2, various embodiments of the test-plug hardware-platform 200 can include various voltage levels (e.g., 24 volts) of power connections and ground connections. These power and ground connections may be jumped manually or configured via, for example, software within, for example, a 24 V power and ground jumper module 211. Additionally, the test-plug hardware-platform 200 of FIG. 2 is shown to include onboard power and power management devices such as a lithium-polymer battery and/or other types of battery and DC-to-DC conversion circuits known in the art.

Figure 3:
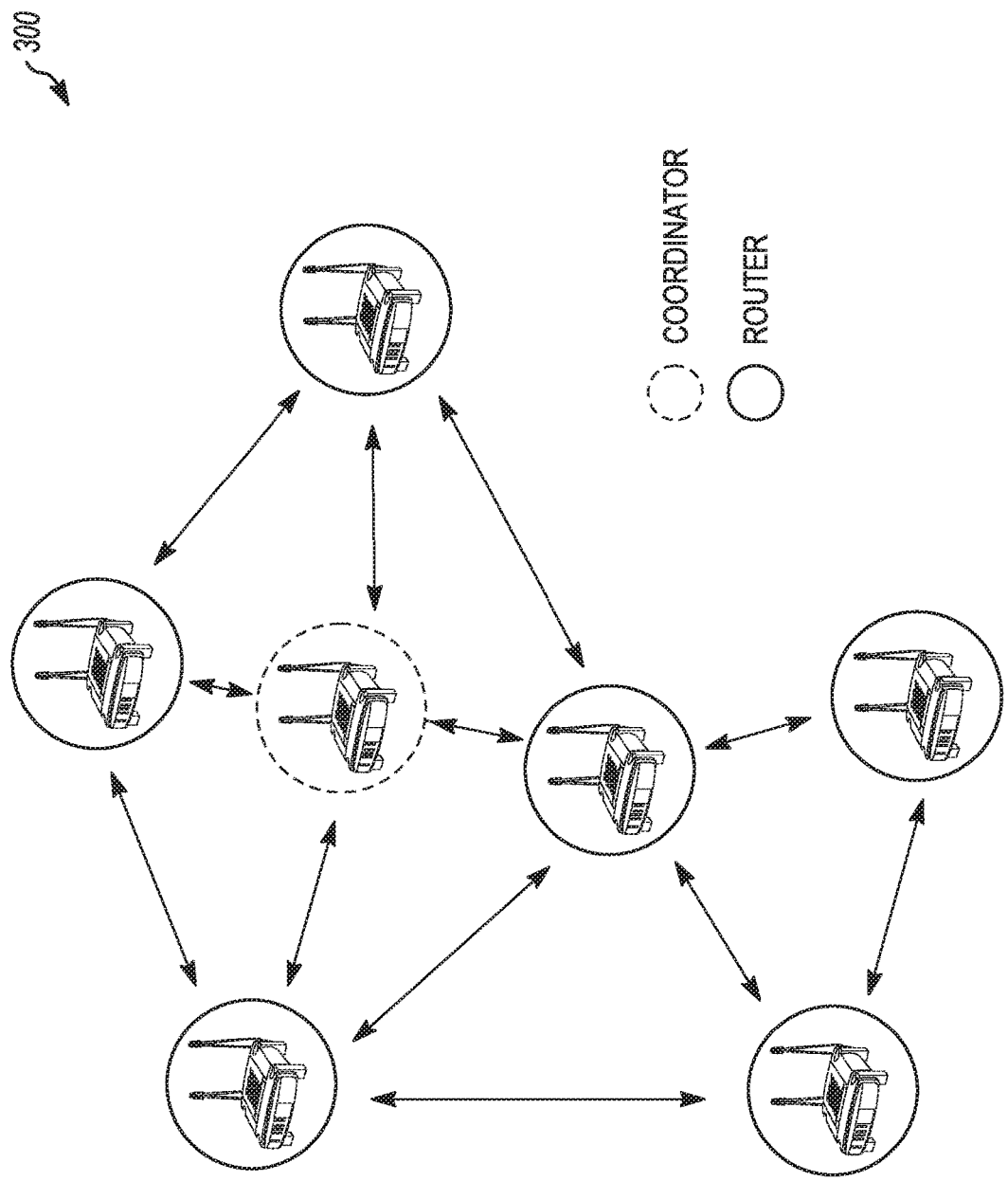
FIG. 3 shows an exemplary embodiment of a wireless mesh network that can be used with the disclosed subject matter, according to various exemplary embodiments.

FIG. 3 shows an example of a wireless-mesh network 300 that can be used with the disclosed subject matter, according to various exemplary embodiments. The wireless-mesh network 300 can eliminate numerous interconnecting cables and jumpers. Further, the wireless mesh network provides for communications between various test-plug hardware-platforms as well as wireless communications with the production tool (or related components thereof) under test. Additionally, a USB® communications device can be used to interface the wireless-mesh network with a computer (e.g., a laptop or tablet computer).

In various embodiments, the wireless-mesh network 300 can utilize a number of different communications standards, host interfaces, and protocols, such as, for example, IEEE 802.15.4, Zigbee®, XBee®, Bluetooth®, and other wireless communications standards and protocols. These standards and protocols, and others, specify various factors such as a physical layer and access control for low-rate wireless networks.

Figure 4:
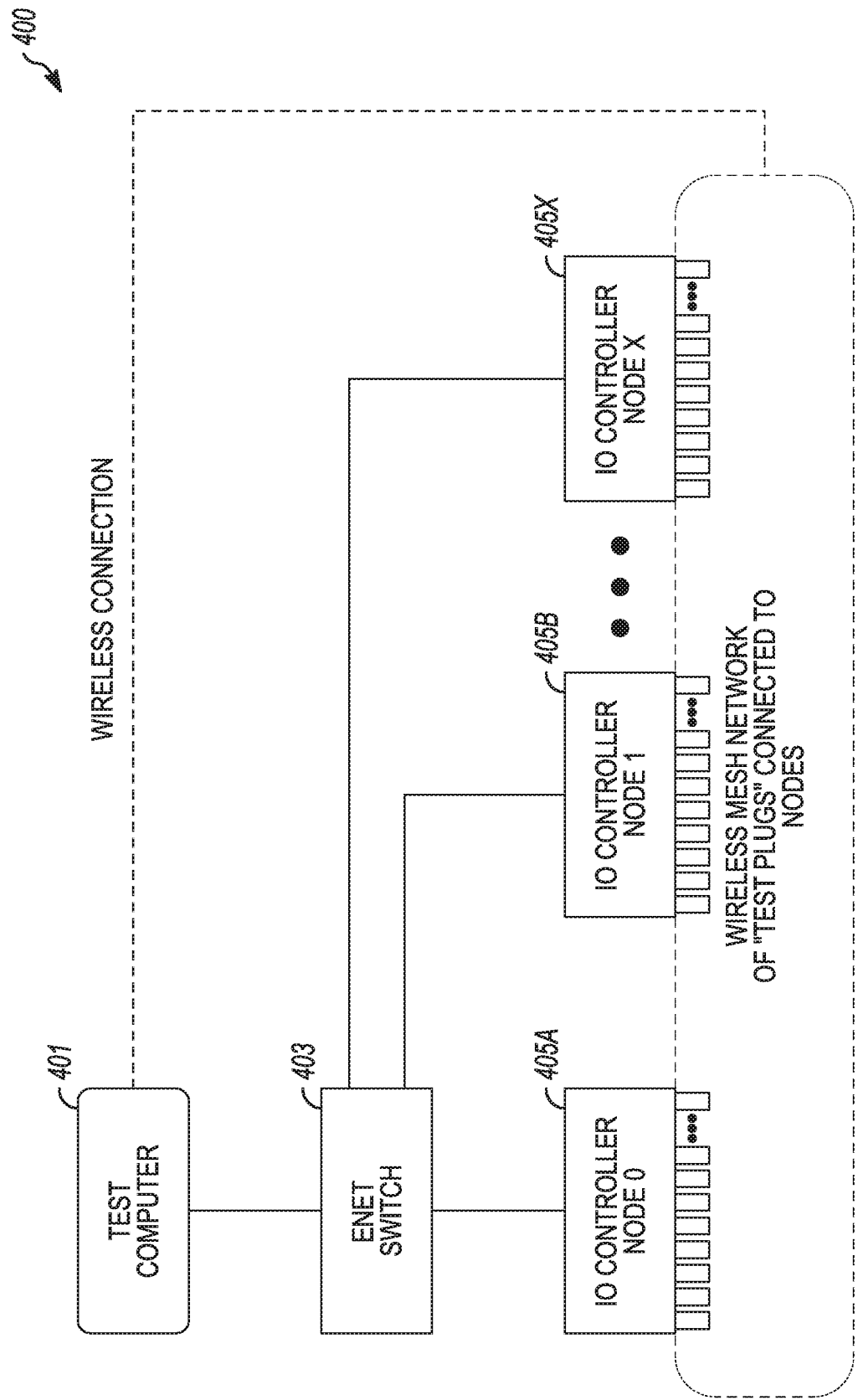
FIG. 4 shows an exemplary embodiment of an implementation of the test-plug hardware-platform when used with, for example, a production tool, according to various exemplary embodiments.

Referring now to FIG. 4, an example of an exemplary embodiment of a test-plug hardware-platform 400 when used with a production tool (or related electrical component, neither of which is shown explicitly but would be well understood to a skilled artisan upon reading and understanding the as-filed Application), according to various exemplary embodiments, is shown. The test-plug hardware-platform 400 may be the same as or similar to the test-plug hardware-platform 200 of FIG. 2.

In a specific exemplary implementation, a number of test-plug hardware-platforms are coupled to a number of nodes, Node 0 405A. Node 1, 405B, ... Node X 405X. Each node is labeled as "IO Controller Node," which is a specific hardware platform that can run, for example, an Ethernet for Control Automation Technology (EtherCAT®) protocol software and/or firmware and that adheres to EtherCAT® standards as developed under IEEE 802 standards. However, any type of wireless type or wired type of node known in the art could be used.

The nodes are electrically and communicatively coupled to (e.g., hardwired or wirelessly coupled), for example, an Ethernet switch 403 (ENET Switch) or an EtherCAT® or ECAT junction box. The ENET Switch 403 is coupled to a test computer 401, which may comprise, for example, a single-board computer (SBC), or other type of MCU or even a laptop computer or tablet computer. The test computer 401 can be used for a number of different purposes as described herein including memory storage and controlling or programming various I/O protocols. In other embodiments, the test computer may also be running a number of simulated devices while actual I/O from the production tool or tools (not shown) is monitored.

In this specific exemplary embodiment, the test computer 401 may be electrically and communicatively coupled to various types of production tools or related types of equipment (not shown). However, the test computer 401 could be coupled directly to, for example, PCBs or other components within a production tool or multiple production tools (not shown). Either the test computer 401 or the production tool may also be in direct wireless communication with the test-plug hardware-platforms through the wireless-mesh network 300 of FIG. 3. In turn, the wireless-mesh network 300 can manage an entire network of test-plug hardware-platforms as needed.

Overall, upon reading and understanding the disclosure provided herein, a person of ordinary skill in the art will recognize that significant advantages of the various embodiments of the test-plug hardware-platform disclosed herein include saving time and saving money. For example, automating testing saves significant time for production tool diagnostics and testing. Further, software testing benefits as well by saving time with hardware-interface testing. Moreover, software testing can be completed before a production tool is built such that integration goes more smoothly and either does not impact or limits impact of a project schedule.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic devices or a number of components, modules, or mechanisms. Modules may constitute either software modules (e.g., code embodied on a machine-readable medium or in a transmission signal) or hardware modules. A "hardware module" is a tangible unit capable of performing certain operations and may be configured or arranged in a certain physical manner. In various embodiments, one or more computer systems (e.g., a standalone computer-system, a client computer-system, or a server computer-system) or one or more hardware modules of a computer system (e.g., a processor or a group of processors) may be configured by software (e.g., an application or application portion) as a hardware module that operates to perform certain operations as described herein.

In some embodiments, a hardware module may be implemented mechanically, electronically, or any suitable combination thereof. For example, a hardware module may include dedicated circuitry or logic that is permanently configured to perform certain operations. For example, a hardware module may be a special-purpose processor, such as a field programmable gate array (FPGA) or an Application-Specific Integrated Circuit (ASIC). A hardware module may also include programmable logic or circuitry that is temporarily configured by software to perform certain operations. For example, a hardware module may include software encompassed within a general-purpose processor or other programmable processor. It will be appreciated that the decision to implement a hardware module mechanically, in dedicated and permanently configured circuitry, or in temporarily configured circuitry (e.g., configured by software) may be driven by cost and time considerations.

Accordingly, the phrase "hardware module" should be understood to encompass a tangible entity, be that an entity that is physically constructed, permanently configured (e.g., hardwired), or temporarily configured (e.g., programmed) to operate in a certain manner or to perform certain operations described herein. As used herein, "hardware-implemented module" refers to a hardware module. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software may accordingly configure a processor or other configurable device, for example, to constitute a particular hardware-module at one instance of time and to constitute a different hardware module at a different instance of time. Additionally, the software may be used to program firmware.

Hardware modules can provide information to, and receive information from, other hardware modules. Accordingly, the described hardware modules may be regarded as being communicatively coupled. Where multiple hardware modules exist contemporaneously, communications may be achieved through signal transmission (e.g., over appropriate circuits and buses) between or among two or more of the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions described herein. As used herein, "processor-implemented module" refers to a hardware module implemented using one or more processors or other configurable components (e.g., such as an FPGA, and ASIC, firmware, of components of the test-plug hardware-platform itself).

Similarly, the methods described herein may be at least partially processor-implemented, a processor being an example of hardware. For example, at least some of the operations of a method may be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an application program interface (API)).

The performance of certain of the operations may be distributed among the one or more processors, not only residing within a single machine, but deployed across a number of machines. In some embodiments, the one or more processors or processor-implemented modules may be located in a single geographic location (e.g., within a home environment, an office environment, or a server farm). In other embodiments, the one or more processors or processor-implemented modules may be distributed across a number of geographic locations.

Figure 5:
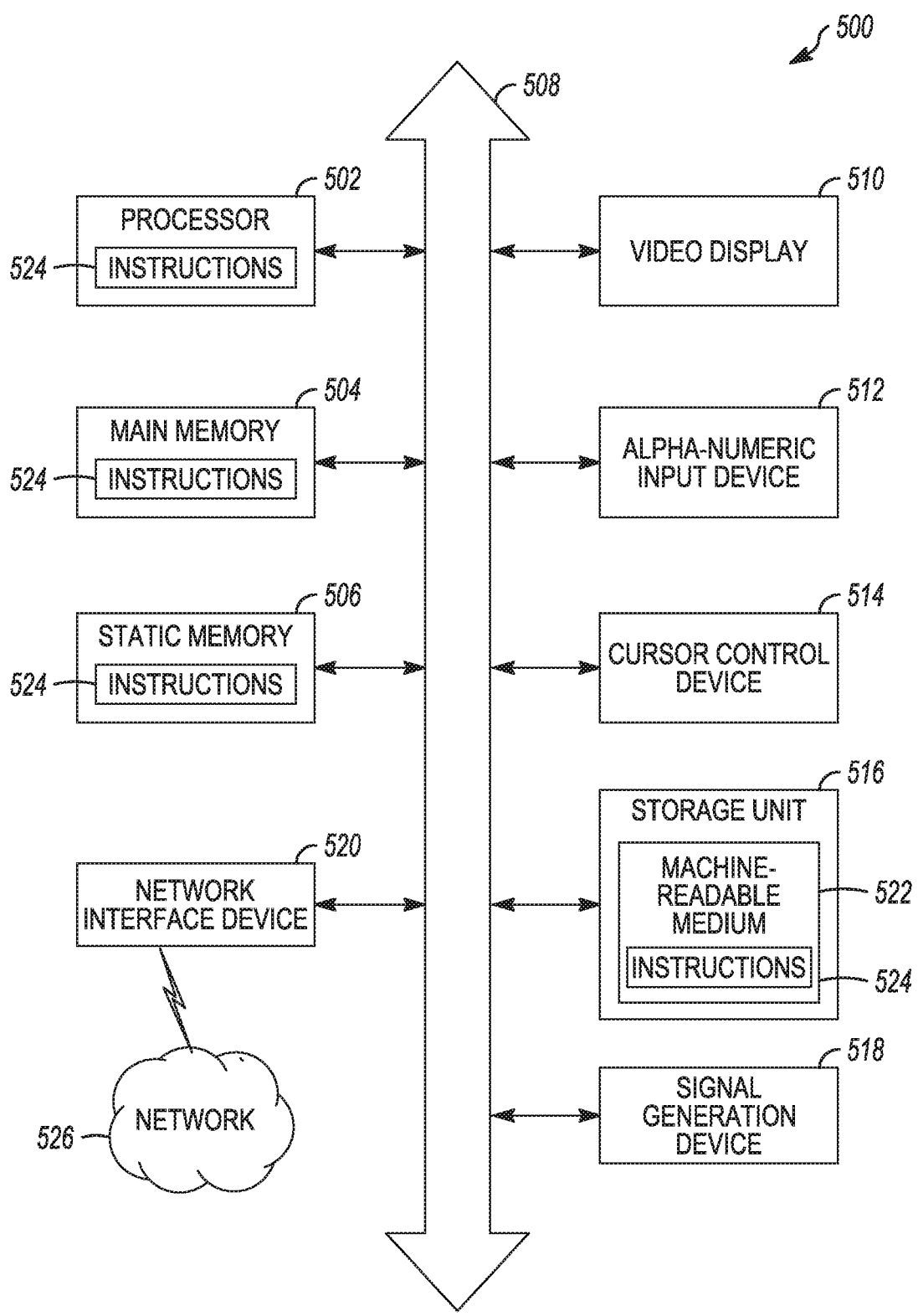
FIG. 5 shows a simplified block diagram of a machine in an example form of a computing system within which a set of instructions for causing the machine to perform any one or more of the methodologies and operations discussed herein may be executed.

FIG. 5 is a block diagram illustrating components of a machine 500, according to some embodiments, able to read instructions from a machine-readable medium e.g., a non-transitory machine-readable medium, a machine-readable storage medium, a computer-readable storage medium, or any suitable combination thereof) and perform any one or more of the methodologies discussed herein. Specifically, FIG. 5 shows a diagrammatic representation of the machine 500 in the example form of a computer system and within which instructions 524 (e.g., software, a program, an application, an applet, an app, or other executable code) for causing the machine 500 to perform any one or more of the methodologies discussed herein may be executed.

In alternative embodiments, the machine 500 operates as a standalone device or may be connected (e.g., networked) to other machines. In a networked deployment, the machine 500 may operate in the capacity of a server machine or a client machine in a server-client network environment, or as a peer machine in a peer-to-peer (or distributed) network environment. The machine 500 may be a server computer, a client computer, a personal computer (PC), a tablet computer, a laptop computer, a netbook, a set-top box (STB), a personal digital assistant (PDA), a cellular telephone, a smartphone, a web appliance, a network router, a network switch, a network bridge, or any machine capable of executing the instructions 524, sequentially or otherwise, that specify actions to be taken by that machine. Further, while only a single machine is illustrated, the term "machine" shall also be taken to include a collection of machines that individually or jointly execute the instructions 524 to perform any one or more of the methodologies discussed herein.

The machine 500 includes a processor 502 (e.g., a central processing unit (CPU), a graphics processing unit (GPU), a digital signal processor (DSP), an application specific integrated circuit (ASIC), a radio-frequency integrated circuit (RFIC), or any suitable combination thereof), a main memory 504, and a static memory 506, which are configured to communicate with each other via a bus 508. The processor 502 may contain microcircuits that are configurable, temporarily or permanently, by some or all of the instructions 524 such that the processor 502 is configurable to perform any one or more of the methodologies described herein, in whole or in part. For example, a set of one or more microcircuits of the processor 502 may be configurable to execute one or more modules (e.g., software modules) described herein.

The machine 500 may further include a graphics display 510 (e.g., a plasma display panel (PDP), a light emitting diode (LED) display, a liquid crystal display (LCD), a projector, or a cathode ray tube (CRT)). The machine 500 may also include an alpha-numeric input device 512 (e.g., a keyboard), a cursor control device 514 (e.g., a mouse, a touchpad, a trackball, a joystick, a motion sensor, or other pointing instrument), a storage unit 516, a signal generation device 518 (e.g., a speaker), and a network interface device 520.

The storage unit 516 includes a machine-readable medium 522 (e.g., a tangible and/or non-transitory machine-readable storage medium) on which is stored the instructions 524 embodying any one or more of the methodologies or functions described herein. The instructions 524 may also reside, completely or at least partially, within the main memory 504, within the processor 502 (e.g., within the processor's cache memory), or both, during execution thereof by the machine 500. Accordingly, the main memory 504 and the processor 502 may be considered as machine-readable media (e.g., tangible and/or non-transitory machine-readable media). The instructions 524 may be transmitted or received over a network 526 via the network interface device 520. For example, the network interface device 520 may communicate the instructions 524 using any one or more transfer protocols (e.g., hypertext transfer protocol (HTTP).

In some embodiments, the machine 500 may be a portable computing device, such as a smart phone or tablet computer, and have one or more additional input components (e.g., sensors or gauges). Examples of such additional input components include an image input component (e.g., one or more cameras), an audio input component (e.g., a microphone), a direction input component (e.g., a compass), a location input component (e.g., a global positioning system (GPS) receiver), an orientation component (e.g., a gyroscope), a motion detection component (e.g., one or more accelerometers), an altitude detection component (e.g., an altimeter), and a gas detection component (e.g., a gas sensor). Inputs harvested by any one or more of these input components may be accessible and available for use by any of the modules described herein.

As used herein, the term "memory" refers to a machine-readable medium able to store data temporarily or permanently and may be taken to include, but not be limited to, random-access memory (RAM), read-only memory (ROM), buffer memory, flash memory, and cache memory. While the machine-readable medium 522 is shown in an embodiment to be a single medium, the term "machine-readable medium" should be taken to include a single medium or multiple media (e.g., a centralized or distributed database, or associated caches and servers) able to store instructions. The term "machine-readable medium" shall also be taken to include any medium, or combination of multiple media, that is capable of storing instructions for execution by a machine (e.g., the machine 500), such that the instructions, when executed by one or more processors of the machine (e.g., the processor 502), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more tangible (e.g., non-transitory) data repositories in the form of a solid-state memory, an optical medium, a magnetic medium, or any suitable combination thereof.

Furthermore, the machine-readable medium is non-transitory in that it does not embody a propagating signal. However, labeling the tangible machine-readable medium as "non-transitory" should not be construed to mean that the medium is incapable of movement—the medium should be considered as being transportable from one physical location to another. Additionally, since the machine-readable medium is tangible, the medium may be considered to be a machine-readable device.

The instructions 524 may further be transmitted or received over a network 526 (e.g., a communications network) using a transmission medium via the network interface device 520 and utilizing any one of a number of well-known transfer protocols (e.g., HTTP). Examples of communication networks include a local area network (LAN), a wide area network (WAN), the Internet, mobile telephone networks, POTS networks, and wireless data networks (e.g., WiFi and WiMAX networks). The term "transmission medium" shall be taken to include any intangible medium that is capable of storing, encoding, or carrying instructions for execution by the machine, and includes digital or analog communications signals or other intangible medium to facilitate communication of such software.

As used herein, the term "or" may be construed in an inclusive or exclusive sense. Further, other embodiments will be understood by a person of ordinary skill in the art upon reading and understanding the disclosure provided. Further, upon reading and understanding the disclosure provided herein, the person of ordinary skill in the art will readily understand that various combinations of the techniques and examples provided herein may all be applied in various combinations.

Although various embodiments are discussed separately, these separate embodiments are not intended to be considered as independent techniques or designs. As indicated above, each of the various portions may be inter-related and each may be used separately or in combination with other test-plug hardware-platform discussed herein. For example, although various embodiments of methods, operations, and processes have been described, these methods, operations, and processes may be used either separately or in various combinations.

Consequently, many modifications and variations can be made, as will be apparent to a person of ordinary skill in the art upon reading and understanding the disclosure provided herein. Functionally equivalent methods and devices within the scope of the disclosure, in addition to those enumerated herein, will be apparent to the skilled artisan from the foregoing descriptions. Portions and features of some embodiments may be included in, or substituted for, those of others. Such modifications and variations are intended to fall within a scope of the appended claims. Therefore, the present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A test-plug hardware-platform, comprising
   at least one combination input and output (I/O) connector;
   a configurable control system to provide command and operational signals through the I/O connector, the configurable control system further to collect data through the I/O connector from at least one electrical component under test, the at least one electrical component under test configured to generate and receive a plurality of signals selected from signals including digital signals and analog signals, the configurable control system being configured to test substantially simultaneously the functionality of all inputs and outputs of the at least one electrical component under test; and
   a wireless-mesh network configured within the test-plug hardware-platform to interface wirelessly with at least the at least one electrical component under test.

2. The test-plug hardware-platform of claim 1, wherein the configurable control system is configured to capture actual input and output signals to and from the at least one electrical component under test.

3. The test-plug hardware-platform of claim 1, wherein the configurable control system further comprises universal I/O circuitry to interface with the at least one I/O connector, one or more programmable logic devices (PLDs) to build reconfigurable digital circuits, one or more microcontroller units (MICUs) to direct data received from and sent to the at least one electrical component under test, and a radio source.

4. The test-plug hardware-platform of claim 1, wherein the radio source is configured to operate under at least one communications standard.

5. The test-plug hardware-platform of claim 4, wherein the communications standard includes at least one standard protocol selected from IEEE 802.15.4, Zigbeee®, XBee®, and Bluetooth®.

6. The test-plug hardware-platform of claim 1, wherein the configurable control system is configured to test each connector on the at least one electrical component under test via software within the test-plug hardware-platform.

7. The test-plug hard-ware-platform of claim 1, wherein the at least one electrical component under test is operating within a production tool.

8. The test-plug hardware-platform of claim 1, wherein the test-plug hardware-platform is configured to test multiple ones of the at least one electrical component under test within a production tool substantially simultaneously.

9. The test-plug hardware-platform of claim 1, wherein the test-plug hardware-platform is configured to test analog signals and digital signals substantially simultaneously.

10. The test-plug hardware-platform of claim 9, wherein at least one of the analog signals and digital signals include video signals.

11. The test-plug hardware-platform of claim 1, wherein the test-plug hardware-platform is configured to supply power to the at least one electrical component under test.

12. The test-plug hardware-platform of claim 1, wherein the test-plug hardware-platform is configured to test low-level communication with the at least one electrical component under test connected to the actual hardware in which each of the at least one electrical component under test is located.

13. The test-plug hardware-platform of claim 1, wherein configuration of software within the configurable control system includes an existing signal list and an interlock table for a particular tool in which the at least one electrical component under test is located.

14. A test-plug hardware-platform comprising:
    at least one combination input and output (I/O) connector; and
    a configurable control system to provide command and operational signals through the I/O connector, the configurable control system further to capture actual input and output signals to and from at least one electrical component under test, the configurable control system being configured to test substantially simultaneously the functionality of all inputs and outputs of the at least one electrical component under test, the at least one electrical component under test configured to generate and receive a plurality of signals selected from signals including digital signals and analog signals, the at least one electrical component under test being operated within a production tool.

15. The test-plug hardware-platform of claim 14, further comprising a wireless electronic control system and a wireless-mesh network to interface wirelessly with the at least electrical component under test.

16. The test-plug hardware-platform of claim 14, wherein the test-plug hardware-platform further comprises power and ground connections to supply to the at least one electrical component under test, the power and ground connections being configurable as an output to the at least one I/O connector via software.

17. The test-plug hardware-platform of claim 14, further comprising a test computer, the test computer being configured to:
    run a number of simulated devices; and
    monitor actual I/O from the each of the at least one electrical component under test.

18. A test-plug hardware-platform, comprising:
    a wireless electronic control system; and
    a configurable control system to provide command and operational signals through the wireless electronic control system, the configurable control system further to collect data through the wireless electronic control system from at least one electrical component under test, the configurable control system being configured to test substantially simultaneously the functionality of all inputs and outputs of the at least one electrical component under test, the at least one electrical component under test configured to generate and receive a plurality of signals selected from signals including digital signals and analog signals, the configurable control system further to capture actual input and output signals to and from the at least one electrical component under test with the at least one electrical component under test being operated within a production tool.

19. A test-plug hardware-platform, wherein the wireless electronic control system is configured to provide communications between test-plug hardware-platform via wireless communications with the production tool.

20. A test-plug hardware-platform, comprising:
at least one combination input and output (I/O) connector;
a configurable control system to provide command and operational signals through the I/O connector, the configurable control system further to collect data through the I/O connector from at least one electrical component under test, the at least one electrical component under test configured to generate and receive a plurality of signals selected from signals including digital signals and analog signals, the configurable control system being configured to test each connector on the at least one electrical component under test via software within the testplug hardware-platform; and
a wireless-mesh network configured within the test-plug hardware-platform to interface wirelessly with at least the at least one electrical component under test.

21. A test-plug hardware-platform, comprising:
at least one combination input and output (I/O) connector;
a configurable control system to provide command and operational signals through the I/O connector, the configurable control system further to collect data through the I/O connector from at least one electrical component under test, the at least one electrical component under test configured to generate and receive a plurality of signals selected from signals including digital signals and analog signals; and
a wireless-mesh network configured within the test-plug hardware-platform to interface wirelessly with at least the at least one electrical component under test, the test-plug hardware-platform being configured to test analog signals and digital signals substantially simultaneously.

22. A test-plug hardware-platform, comprising:
at least one combination input and output-(I/O) connector;
a configurable control system to provide command and operational signals through the I/O connector, the configurable control system further to collect data through the I/O connector from at least one electrical component under test, the at least one electrical component under test configured to generate and receive a plurality of signals selected from signals including digital signals and analog signals; and
a wireless-mesh network configured within the test-plug hardware-platform to interface wirelessly with at least the at least one electrical component under test, the test-plug hardware-platform being configured to test low-level communication with the at least one electrical component test under test connected to the actual hardware in which each of the at least one electrical component under test is located.

23. A test-plug hardware-platform, comprising:
at least one combination input and output (I/O) connector;
a configurable control system to provide command and operational signals through the I/O connector, the configurable control system further to collect data through the I/O connector from at least one electrical component under test, the at least one electrical component under test configured to generate and receive a plurality of signals selected from signals including digital signals and analog signals, configuration of software within the configurable control system including an existing signal list and an interlock table for a particular tool in which the at least one electrical component under test is located; and
a wireless-mesh network configured within the test-plug hardware-platform to interface wirelessly with at least the at least one electrical component under test.

24. A test-plug hardware-platform, comprising:
at least one combination input and output (I/O) connector;
a configurable control system to provide command and operational signals through the I/O connector, the configurable control system further to capture actual input and output signals to and from at least one electrical component under test, the at least one electrical component under test configured to generate and receive a plurality of signals selected from signals including digital signals and analog signals, the at least one electrical component under test being operated within a production tool; and
a test computer configured to run a number of simulated devices and monitor actual I/O from each of the at least one electrical component under test.

* * * * *